(12) United States Patent  
Senoo

(10) Patent No.: US 8,735,974 B2  
(45) Date of Patent: May 27, 2014

(54) SEMICONDUCTOR DEVICES

(75) Inventor: Masaru Senoo, Okazaki (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 30 days.

(21) Appl. No.: 13/579,440

(22) PCT Filed: Feb. 16, 2010

(86) PCT No.: PCT/JP2010/052284  
§ 371 (c)(1),  
(2), (4) Date: Aug. 16, 2012

(87) PCT Pub. No.: WO2011/101955  
PCT Pub. Date: Aug. 25, 2011

(65) Prior Publication Data  
US 2012/0313164 A1    Dec. 13, 2012

(51) Int. Cl.  
*H01L 29/76*     (2006.01)  
*H01L 29/94*     (2006.01)

(52) U.S. Cl.  
USPC ........... 257/330; 257/331; 257/332; 257/333; 438/259; 438/270

(58) Field of Classification Search  
USPC ........... 257/330–333, E29.262; 438/259, 270  
See application file for complete search history.

(56) References Cited

U.S. PATENT DOCUMENTS

| | | | |
|---|---|---|---|
| 6,781,199 B2 | 8/2004 | Takahashi | |
| 7,521,755 B2 * | 4/2009 | Takahashi | 257/330 |
| 2005/0287744 A1 | 12/2005 | Ono | |
| 2007/0045727 A1 | 3/2007 | Shiraishi | |
| 2008/0067542 A1 * | 3/2008 | Tanaka et al. | 257/139 |
| 2008/0073707 A1 | 3/2008 | Darwish | |
| 2008/0315249 A1 | 12/2008 | Minato | |
| 2010/0167516 A1 | 7/2010 | Minato | |
| 2011/0039384 A1 | 2/2011 | Darwish | |

FOREIGN PATENT DOCUMENTS

| | | |
|---|---|---|
| JP | 6-326316 A | 11/1994 |
| JP | 2002-353456 A | 12/2002 |
| JP | 2004-014858 A | 1/2004 |
| JP | 2006-012967 A | 1/2006 |
| JP | 2007-059636 A | 3/2007 |

(Continued)

OTHER PUBLICATIONS

International Search Report mailed May 25, 2010 of PCT/JP2010/052284.

*Primary Examiner* — Theresa T Doan  
(74) *Attorney, Agent, or Firm* — Kenyon & Kenyon LLP

(57) ABSTRACT

An object of the present application is to reduce the gate capacitance without lowering the withstand voltage of a semiconductor device and prevent generation of a leak current between main electrodes even when an oxide film is formed poorly. A semiconductor device of the present application comprises a gate electrode and a dummy gate electrode. The gate electrode is insulated from an emitter electrode and faces a part of a body region via an insulating film, the part of the body region separating a drift region and an emitter region from each other. The dummy gate electrode is electrically connected with the emitter electrode and is connected with the drift region and the body region via the insulating film. At least a part of the dummy gate electrode comprises a first conductive region of the same type as the drift region. In the dummy gate electrode, the emitter electrode is separated from the drift region by the first conductive region.

9 Claims, 14 Drawing Sheets

(56) References Cited

FOREIGN PATENT DOCUMENTS

| | | | |
|---|---|---|---|
| JP | 2008-235600 A | 10/2008 | |
| JP | 2009-004496 A | 1/2009 | |
| JP | 2009-212237 A | 9/2009 | |
| WO | 2008/039459 A1 | 4/2008 | |

* cited by examiner

SEMICONDUCTOR DEVICES

This is a 371 national phase application of PCT/JP 2010/052284 filed 16 Feb. 2010, the contents of which are incorporated herein by reference.

TECHNICAL FIELD

The present application relates to a bipolar semiconductor device that is turned on/off by a control on a voltage applied to a gate electrode.

BACKGROUND ART

This type of semiconductor device is required to reduce gate capacitance in order to increase the switching speed. Because the gate capacitance increases in proportion to the number of gate electrodes, reduction of the gate capacitance can be realized by reducing the number of gate electrodes. However, simply reducing the number of gate electrodes disturbs the potential distribution in the semiconductor device when the semiconductor device is turned off, reducing the withstand voltage of the semiconductor device. For this reason, Japanese Patent Application Publication No. 2002-353456 proposes the following technology.

The semiconductor device disclosed in Japanese Patent Application Publication No. 2002-353456 is provided with first and second trenches that penetrate a body region from an upper surface of a semiconductor substrate to reach a drift region. A gate electrode that is insulated from an emitter electrode is formed inside the first trench. A polysilicon region that is electrically connected with the emitter electrode is formed inside the second trench. Because there are no gate electrodes formed in the second trench of this semiconductor device, the number of gate electrodes can be reduced. Therefore, reduction of gate capacitance can be achieved in this semiconductor device. In addition, because the polysilicon region of the second trench is electrically connected with the emitter electrode, the same potential as that for the emitter electrode is applied to the polysilicon region. Thus, when the semiconductor device is turned off, the polysilicon region of the second trench is applied with the same potential as that of the gate electrode, preventing the potential distribution in the semiconductor device from being disturbed. As a result, the decline of the withstand voltage of the semiconductor device is prevented.

SUMMARY OF INVENTION

Technical Problem

In the semiconductor device described above, an n-type polysilicon region is formed inside the second trench. This n-type polysilicon region is connected with an n-type drift region by a thin oxide film. When the oxide film for covering the polysilicon region is formed poorly, the polysilicon region and the drift region are electrically connected with each other. In a bipolar semiconductor device, a collector region is formed in contact with a drift region. Therefore, when the oxide film for covering the polysilicon region is formed poorly, carrier flows from a collector electrode to an emitter electrode via the collector region, drift region, and polysilicon region when the semiconductor device is turned off. In other words, when the semiconductor device is off, a leak current flows between the collector electrode and the emitter electrode.

The present application was contrived in view of the circumstances described above. An object of the present application is to provide a semiconductor device that is capable of reducing gate capacitance without lowering the withstand voltage of the semiconductor device and capable of preventing a flow of leak current between main electrodes even when an oxide film is formed poorly.

Solution to Technical Problem

A semiconductor device of the present application comprises a first semiconductor region, a second semiconductor region, a third semiconductor region, and a fourth semiconductor region. The first semiconductor region is of a first conductive type. The second semiconductor region is of a second conductive type and is in contact with the first semiconductor region. The third semiconductor region is of the first conductive type and is in contact with the second semiconductor region and is separated from the first semiconductor region by the second semiconductor region. The fourth semiconductor region is of the second conductive type and is in contact with the third semiconductor region and is separated from the first and second semiconductor regions by the third semiconductor region.

This semiconductor device also comprises a first main electrode, a second main electrode, a gate electrode, and a conductive region. The first main electrode is electrically connected with the first semiconductor region. The second main electrode is electrically connected with the third semiconductor region and the fourth semiconductor region. The gate electrode is insulated from the second main electrode, connected with the second, third and fourth semiconductor regions via a first insulating film, and opposing a part of the third semiconductor region via the first insulating film, the part of the third semiconductor region separating the fourth semiconductor region from the second semiconductor region. The conductive region is electrically connected with the second main electrode and connected with the second and third semiconductor regions via a second insulating film. At least a part of the conductive region comprises a first conductive region of the first conductive type. In this conductive region, the second main electrode is separated from the second semiconductor region by the first conductive region.

The terms "first conductive type" and "second conductive type" mean either "n-type" or "p-type." In other words, when the first conductive type is the n-type, the second conductive type is the p-type. When the first conductive type is the p-type, the second conductive type is the n-type.

In this semiconductor device, the number of gate electrodes can be reduced by providing the conductive region. Therefore, the gate capacitance of the semiconductor device can be reduced. The conductive region is electrically connected with the second main electrode and is applied with the same potential as that for the second main electrode. This can prevent the potential distribution in the semiconductor device from being disturbed when the semiconductor device is off, preventing the decline of the withstand voltage of the semiconductor device. Moreover, in the conductive region, the first conductive region of the first conductive type is formed, and the second main electrode is separated from the second semiconductor region by the first conductive region. In other words, the second main electrode is separated from the second semiconductor region by the first conductive region of the first conductive type that is the opposite to the second semiconductor region of the second conductive type. Therefore, even when the second insulating film for covering the conductive region is formed poorly, carrier (first conductive type)

flowing from the first semiconductor region of the first conductive type into the second semiconductor region can be prevented from flowing to the second main electrode via the first conductive region.

In the semiconductor device described above, the conductive region may further be provided with a second conductive region. In this case, the second conductive region may be of the second conductive type and may be in contact with the first conductive region. A second conductive type impurity concentration of the second conductive region may be lower than that of the second semiconductor region. In the conductive region, the second main electrode may be separated from the second conductive region by the first conductive region, and the second semiconductor region may be separated from the first conductive region by the second conductive region.

According to this configuration, a p-n junction is formed at a boundary between the first conductive region and the second conductive region. The second conductive type impurity concentration of the second conductive region is lower than that of the second semiconductor region. Therefore, even when the second insulating film for covering the conductive region is formed poorly, a depletion layer spreads from the p-n junction formed at the boundary between the first conductive region and the second conductive region when the semiconductor device is off. As a result, the withstand voltage of the semiconductor device can be maintained. In one aspect of this configuration, for example, the first conductive region is disposed on the second main electrode side, and the second conductive region is disposed on the second semiconductor region side.

In the semiconductor device described above, the first conductive type may be p type, and the second conductive type may be n type. In this case, it is preferred that the first conductive region of the p type be in contact with the second main electrode and not in contact with the second insulating film. Because the first conductive region of the p type is not in contact with the second insulating film, an impurity (e.g., boron) that is implanted into the first conductive region is prevented from penetrating the second insulating film to move to the third semiconductor region and the like.

In the semiconductor device described above, the conductive region may be in contact with the fourth semiconductor region via the second insulating film and can oppose a part of the third semiconductor region via the second insulating film, the part of the third semiconductor region separating the fourth semiconductor region from the second semiconductor region. According to this configuration, the gate electrode and the conductive region can be provided with substantially the same configuration.

The semiconductor device described above may be a trench gate type semiconductor device. In other words, the third semiconductor region may be disposed below and lateral to the fourth semiconductor region. The second semiconductor region may be disposed below the third semiconductor region. The first semiconductor region may be disposed below the second semiconductor region. The first main electrode may be disposed below the first semiconductor region. The second main electrode may be disposed on an upper side of the third and fourth semiconductor regions. The gate electrode may be disposed within a first trench that penetrates the third semiconductor region from an upper surface of the fourth semiconductor region and readies the second semiconductor region. The conductive region may be disposed within a second trench that penetrates the third semiconductor region and reaches the second semiconductor region.

In the trench gate type semiconductor device described above, the conductive region may further be provided with a second conductive region. In this case, the second conductive region may be of the second conductive type, may be disposed at a bottom of the second trench, and may be in contact with the first conductive region. A second conductive type impurity concentration of the second conductive region may be lower than that of the second semiconductor region. The first conductive region may be disposed on an upper side of the second conductive region. A boundary between the first conductive region and the second conductive region may preferably be at the same height as a boundary between the second semiconductor region and the third semiconductor region. In this semiconductor device, a p-n junction surface formed at the boundary between the first conductive region and the second conductive region is at the same height as a p-n junction surface formed at the boundary between the second semiconductor region and the third semiconductor region. Therefore, when the second insulating film for covering the conductive region is formed poorly, the withstand voltage of the semiconductor device can be favorably improved.

The semiconductor device described above may be a planar gate type semiconductor device. In other words, the third semiconductor region may be provided below and lateral to the fourth semiconductor region. The second semiconductor region may be provided below and lateral to the third semiconductor region. The first semiconductor region may be provided below the second semiconductor region. The first main electrode may be provided below the first semiconductor region. The second main electrode may be provided on an upper side of the third and fourth semiconductor regions. The gate electrode may be connected with upper surfaces of the fourth, third, and second semiconductor regions via the first insulating film. The conductive region may be connected with the upper surfaces of the third and second semiconductor regions via the second insulating film.

DESCRIPTION OF EMBODIMENTS

<Embodiment >1

Figure 1:
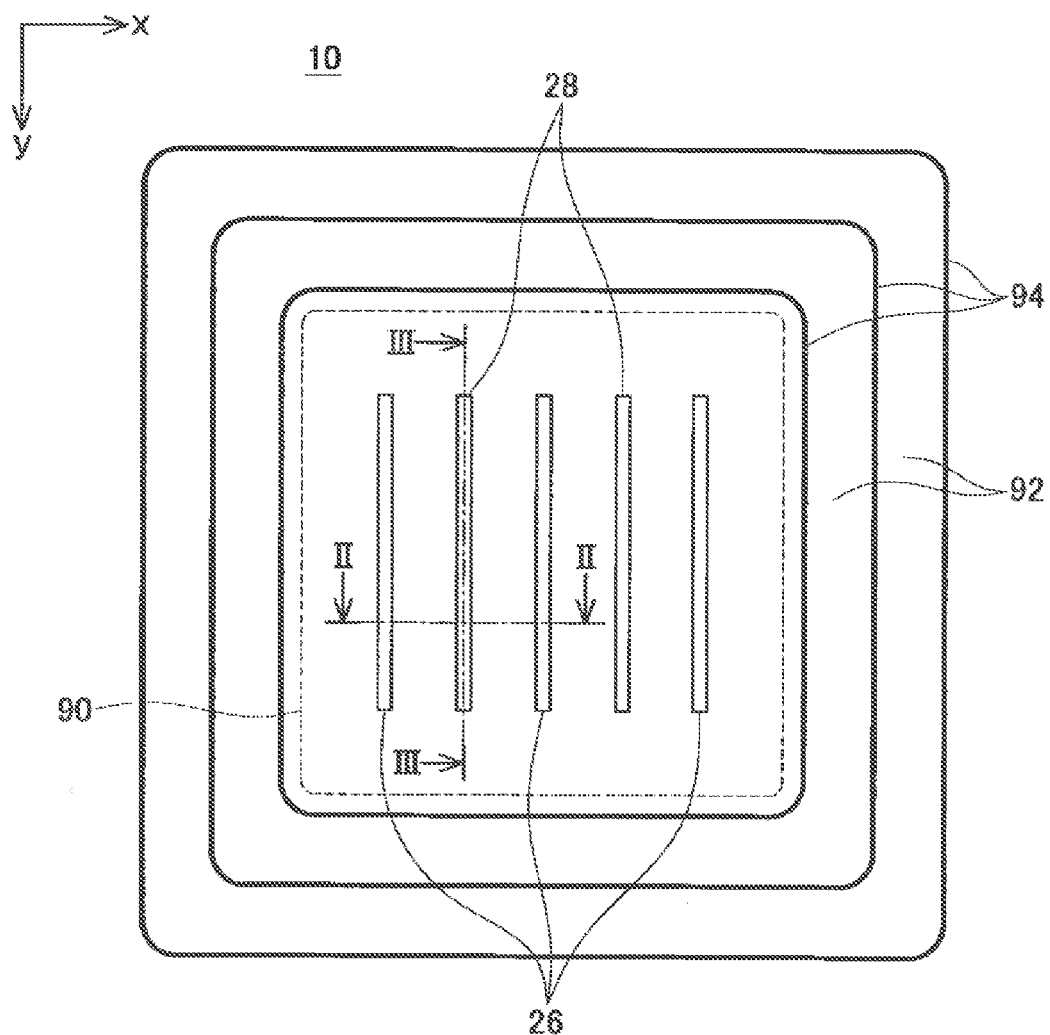
FIG. 1 is a plan view of a semiconductor device 10 according to Embodiment 1.

A semiconductor device 10 according to Embodiment 1 is described. As shown in FIG. 1, the semiconductor device 10 comprises a cell region 90 in which a semiconductor element is formed, and a terminal region 92 surrounding the cell region 90. Note that FIG. 1 does not show electrodes and the like Jaunted on an upper surface of a semiconductor substrate. A plurality of gate trenches 26 and a plurality of dummy gate trenches 28 are formed in the cell region 90. The gate trenches 26 extend in a y-direction of FIG. 1 and axe arranged in an x-direction of FIG. 1 at fixed intervals. Each of the dummy gate trenches 28 is the same size as the gate trenches 26 and disposed between adjacent gate trenches 26. As with the gate trenches 26, the dummy gate trenches 28 extend in the y-direction of FIG. 1 and are arranged in the x-direction of FIG. 1 at intervals. Terminal trenches 94 are formed in the terminal region 92. The terminal trenches 94 are disposed in circles around the cell region 90. The terminal trenches 94 are tilled with, for example, an insulator. The cell region 90 and the terminal region 92 are formed on the same semiconductor substrate. A known substrate e.g., a silicon substrate (Si substrate), a silicon carbide substrate (SiC substrate), etc.) can be used as the semiconductor substrate.

Figure 2:
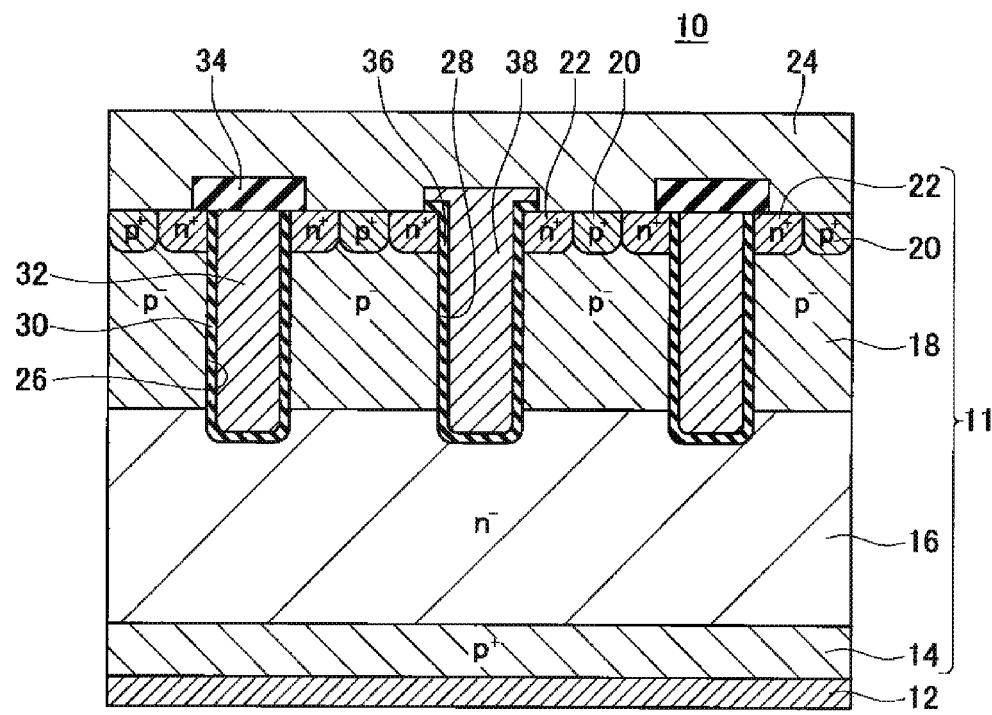
FIG. 2 is a cross-sectional diagram taken along line II-II of FIG. 1.
Figure 3:
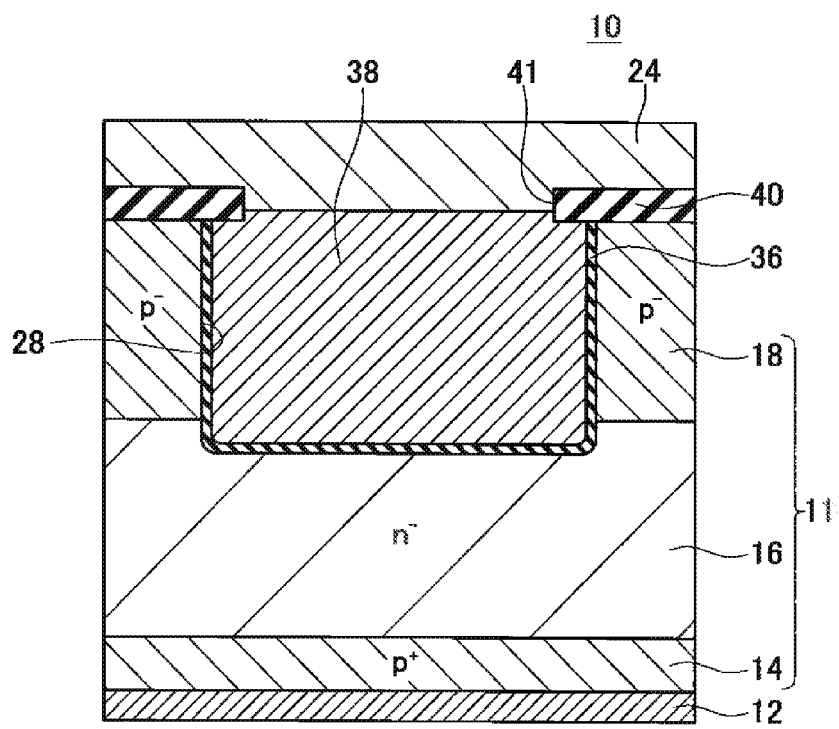
FIG. 3 is across-sectional diagram taken along line III-III of FIG. 1.

As shown in FIGS. 2 and 3, a vertical IGBT (Insulated Gate Bipolar Transistor) is formed in the semiconductor device 10. The semiconductor device 10 comprises a semiconductor substrate 11, metal layers 12 and 24 formed on upper and lower surfaces of the semiconductor substrate 11 respectively, and insulating films 34 and 40.

The gate trenches 26 and the dummy gate trenches 28 are formed on the semiconductor substrate 11. The gate trenches 26 penetrate emitter regions 22 and a low-concentration body region 18, which are described hereinafter. Lower ends of the gate trenches 26 extend to a drift region 16. A gate electrode 32 is formed within each of the gate trenches 26. The gate electrodes 32 are formed in a manner that lower ends thereof extend slightly below lower surfaces of the low-concentration body region 18. Polysilicon, TiN, TaSiN, or the like can be used as the material of the gate electrodes 32. The space between a wall surface of each gate trench 26 and the gate electrode 32 thereof (i.e., the sides and the bottom of the gate electrode 32) is filled with an insulator (insulating film) 30. Therefore, each gate electrode 32 faces the low-concentration body region 18 and the emitter region 22 via the insulator 30 and is connected with the drift region 16, the low-concentration body region 18, and the emitter region 22 via the insulator 30. An interlayer insulating film 34 is formed on top of each gate electrode 32. Thus, each gate electrode 32 is insulated from the emitter electrode 24.

It is preferred that polysilicon doped with an n-type impurity be used for the gate electrodes 32. Using a material doped with a p-type impurity (boron) for the gate electrodes 32 might cause the p-type impurity (boron) to penetrate the insulators 30 and move to the low-concentration body region 18 (so-called boron penetration), causing fluctuations in a threshold voltage of the semiconductor device 10.

As shown in FIGS. 2 and 3, and as with the gate trenches 26, the dummy gate trenches 28 penetrate the emitter region 22 and the low-concentration body region 18. A lower end of each dummy gate trench 28 extends to the drift region 16. The lower end of the dummy gate trench 28 is at the same position as the lower end of each gate trench 26. A p-type conductive region 38 is formed in each dummy gate trench 28. Polysilicon doped with a p-type impurity, TiN with p-type characteristics, or other material can be used for the conductive region 38. As with the gate electrodes 32, the conductive region 38 is formed in a manner that a lower end thereof extends slightly below the lower surfaces of the low-concentration body region 18. The space between a wall surface of each dummy gate trench 28 and the conductive region 38 thereof (i.e., the sides and the bottom of the conductive region 38) is filled with an insulator (insulating film) 36. Therefore, the conductive region 38, too, faces the low-concentration body region 18 and the emitter region 22 via the insulator 36 and is connected with the drift region 16, the low-concentration body region 18, and the emitter region 22 via the insulator 36. Furthermore, as shown in FIG. 3, an insulating film 40 is provided on an upper surface of the semiconductor substrate 11. An opening 41 is formed in the insulating film 40. An upper end of the conductive region 38 is electrically connected with the emitter electrode 24 through the opening 41 of the insulating film 40. As shown in FIG. 2, an upper end part of each conductive region 38 is wider laterally than the dummy gate trench 28. In this manner, a large area of contact is secured between the conductive region 38 and the emitter electrode 24.

As is clear from the above description, while the upper end of the conductive region 38 is in contact with the emitter electrode 24, a lower end of the conductive region 38 is connected with the drift region 16 via the insulator 36. Therefore, the emitter electrode 24 is separated from the drift region 16 by the conductive region 38 in the section where the dummy gate trench 28 is formed.

The n$^+$ type emitter regions 22 and p$^+$ type body contact regions 20 are formed in a region near the upper surface of the semiconductor substrate 11. The emitter regions 22 adjacent to each gate trench 26 are in contact with the insulator 30, and the emitter regions 22 adjacent to each dummy gate trench 28 are in contact with the insulator 36. The body contact regions 20 are formed in contact with the emitter regions 22.

The p⁻ type low-concentration body region 18 are formed below the emitter regions 22 and the body contact regions 20. The impurity concentration of the low-concentration body region 18 is lower than that of the body contact regions 20. The low-concentration body region 18 is in contact with the emitter regions 22 and the body contact regions 20 and in contact with the insulators 30 and 36 below the emitter regions 22. Thus, the emitter regions 22 are surrounded by the low-concentration body region 18 and the body contact regions 20.

The n⁻ type drift region 16 is formed under the low-concentration body region 18. The drift region 16 is formed over the entire surface of the semiconductor substrate 11. The drift region 16 is in contact with the lower surfaces of the low-concentration body region 18. The drift region 16 is separated from the emitter regions 22 by the low-concentration body region 18.

A p⁺ type collector region 14 is formed in a region near the lower surface of the semiconductor substrate 11. The collector region 14 is formed over the entire surface of the semiconductor substrate 11. The collector region 14 is in contact with a lower surface of the drift region 16. The collector region 14 is separated from the low-concentration body region 18 by the drift region 16.

The collector electrode 12 is formed on the lower surface of the semiconductor substrate 11. The collector electrode 12 is formed over the entire surface of the semiconductor substrate 11. The collector electrode 12 is in ohmic-contact with the collector region 14. The emitter electrode 24 is formed on the upper surface of the semiconductor substrate 11. The emitter electrode 24 is formed inside the cell region 90. The emitter electrode 24 is formed to cover the interlayer insulating film 34 and insulated from the gate electrodes 32. The emitter electrode 24 is in ohmic-contact with the emitter regions 22, the body contact regions 20, and the conductive regions 38.

Operations of the semiconductor device 10 are now described. An on-potential (which is equal to or higher than a potential required for forming a channel) is applied to the gate electrodes 32, while having the emitter electrode 24 connected to a ground potential and the collector electrode 12 connected with a power supply potential. As a result, the semiconductor device 10 is turned on. In other words, the application of the on-potential to the gate electrodes 32 forms a channel at parts of the low-concentration body region 18 in contact with the insulator 30. However, no channel is formed at parts of the low-concentration body region 18 in contact with the insulator 36 on an inner wall surface of the dummy gate trenches 28. Consequently, electrons flow from the emitter electrode 24 to the collector electrode 12 via the emitter regions 22, channels, drift region 16, and collector region 14. In addition, holes flow from the collector electrode 12 to the emitter electrode 24 via the collector region 14, drill region 16, low-concentration body region 18, and body contact regions 20. In other words, a current flows from the collector electrode 12 to the emitter electrode 24. In the semiconductor device 10, the conductive regions 38 are provided in place of the gate electrodes 32. Therefore, the number of gate electrodes 32 is lower by the number of conductive regions 38. Thus, the gate capacitance is reduced, and the semiconductor device 10 is turned on in a short time by the application of the on-potential to the gate electrodes 32.

When the potential applied to the gate electrodes 32 is switched from the on-potential to an off potential (i.e., ground potential), the IGBT is turned off. Because the gate capacitance is reduced in the semiconductor device 10, switching the potential applied to the gate electrodes 32 to the off-potential (ground potential) erases the channel in a short time, turning the semiconductor device 10 off.

Once the semiconductor device 10 is turned off a depletion layer spreads from a p-n junction between the low-concentration body region 18 and the drift region 16, and then a withstand voltage is ensured between the emitter electrode 24 and the collector electrode 12. Because the conductive regions 38 are electrically connected with the emitter electrode 24, the same potential as that of the emitter electrode 24 (e.g., ground potential) is applied to the conductive regions 38. As a result, the same potential (ground potential) is applied to the conductive regions 38 and the gate electrodes 32, preventing the potential distribution of the semiconductor device 10 from being disturbed. In other words, reducing the number of gate electrodes 32 intensely concentrates an electric field to a tip end part of each gate electrode 32, lowering the withstand voltage of the semiconductor device 10. However, providing the conductive regions 38 eases up the concentration of the electric fields on the gate electrodes 32 and the conductive regions 38, preventing the potential distribution of the semiconductor device 10 from being disturbed. As a result, the decline of the withstand voltage of the semiconductor device 10 is prevented.

Poor formation of the insulators 36 for covering the conductive regions 38 results in an electrical connection between the conductive regions 38 and the drift region 16. However, because the conductive regions 38 are of the p-type and the drift region 16 is of the n-type, the p-n junction is formed at the boundary therebetween. Therefore, carriers (holes) flowing from the collector region 14 to the drill region 16 are prevented from flowing to the emitter electrode 24 through the p-type conductive regions 38. This can prevent generation of a lea current between the emitter and the collector when turning the semiconductor device 10 off.

As described above, the semiconductor device 10 of Embodiment 1 is provided with the conductive regions 38 that are electrically connected with the emitter electrode 24, so that the withstand voltage of the semiconductor device 10 can be ensured, while reducing the gate capacitance and increasing the switching speed. Moreover, even when the insulators 36 for covering the conductive regions 38 are formed poorly, the conductive regions 38 have a conductivity type opposite to that of the drift region 16. This can prevent the generation of the leak current between the emitter and the collector when turning the semiconductor device 10 off.

The semiconductor device 10 of Embodiment 1 has a high tolerance for poor formation of the insulators 36 for covering the conductive regions 38. Therefore, the yield rate of production of the semiconductor device can be improved. Moreover, the insulators 36 can be made thin, which can expand the possibility of the design of the semiconductor device. In addition, a strict inspection does not have to be performed to check whether the insulators 36 are formed poorly or not. This eliminates the need to obtain facilities for the inspection (large current devices and the like).

The semiconductor device 10 of Embodiment 1 described above has three gate electrodes 32 and two conductive regions 38; however, the technology of the present application is not limited to this embodiment. The numbers and arrangements of gate electrodes and the conductive regions can be determined appropriately in accordance with the characteristics required for the semiconductor device 10. For instance, it is not necessary to dispose the gate electrodes and the conductive regions alternately as in the embodiment described above; thus, the conductive regions may be disposed continuously. Furthermore, since the central part of the semiconductor substrate tends to become hot, many conductive regions may be disposed around in the central part of the semiconductor substrate. In other words, the number of conductive regions to be disposed in the central part of the semiconductor substrate may be higher than the number of conductive regions disposed in the peripheral part of the semiconductor substrate.

In Embodiment 1 described above, each conductive region 38 is partially (i.e., the opening 41 of the insulating film 40) connected electrically with the emitter electrode 24 in a longitudinal direction; however, the entire conductive region may be in contact with the emitter electrode in the longitudinal direction.

In Embodiment 1 described above, only the IGBT is formed in the semiconductor substrate 11. However, the technology of the present application can be applied to a semiconductor device that has the IGBT region and diode region formed on the same semiconductor substrate. In this case, at least one of the gate electrodes provided in the IGBT region may be configured as a conductive region connected electrically with the emitter electrode.

In Embodiment 1 described above, the upper end part of each conductive region 38 is slightly wider laterally than the dummy gate trench 28 and connected to the emitter electrode 24. However, the technology of the present application is not limited to this embodiment.

Figure 4:
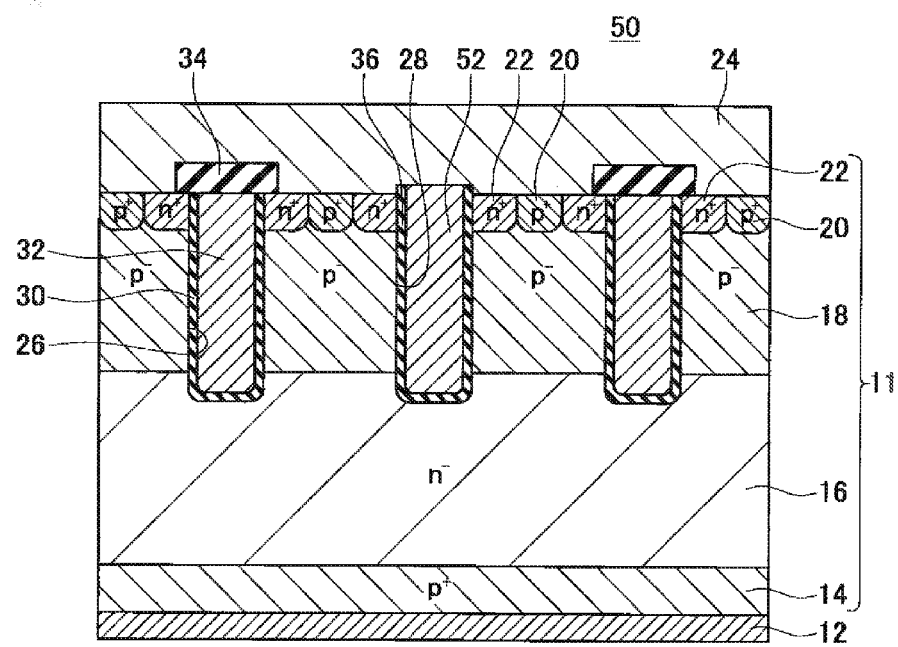
FIG. 4 is a cross-sectional diagram of a semiconductor device according to a modification of Embodiment 1.
Figure 5:
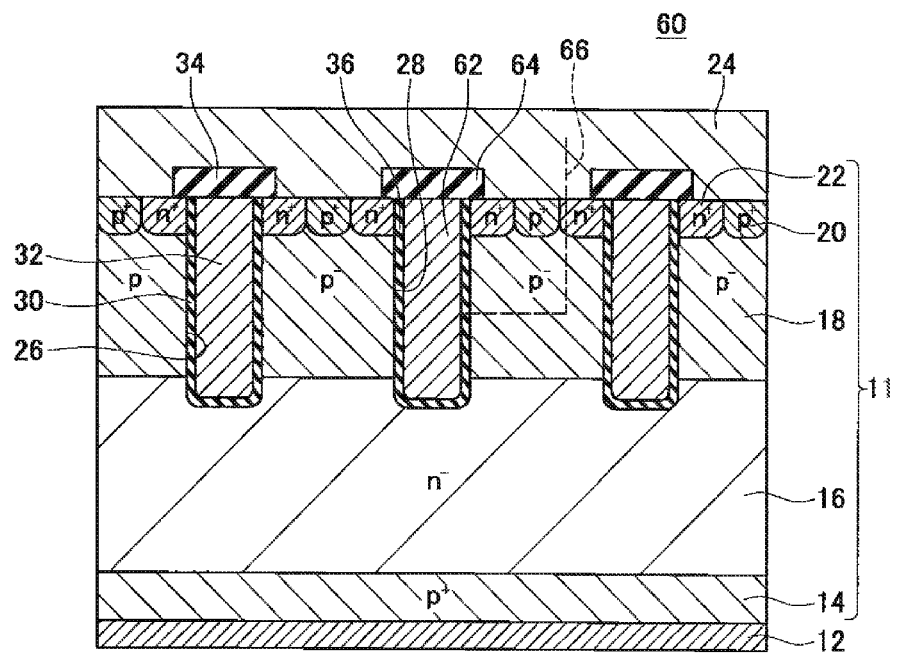
FIG. 5 is a cross-sectional diagram of a semiconductor device according to another modification of Embodiment 1.
Figure 6:
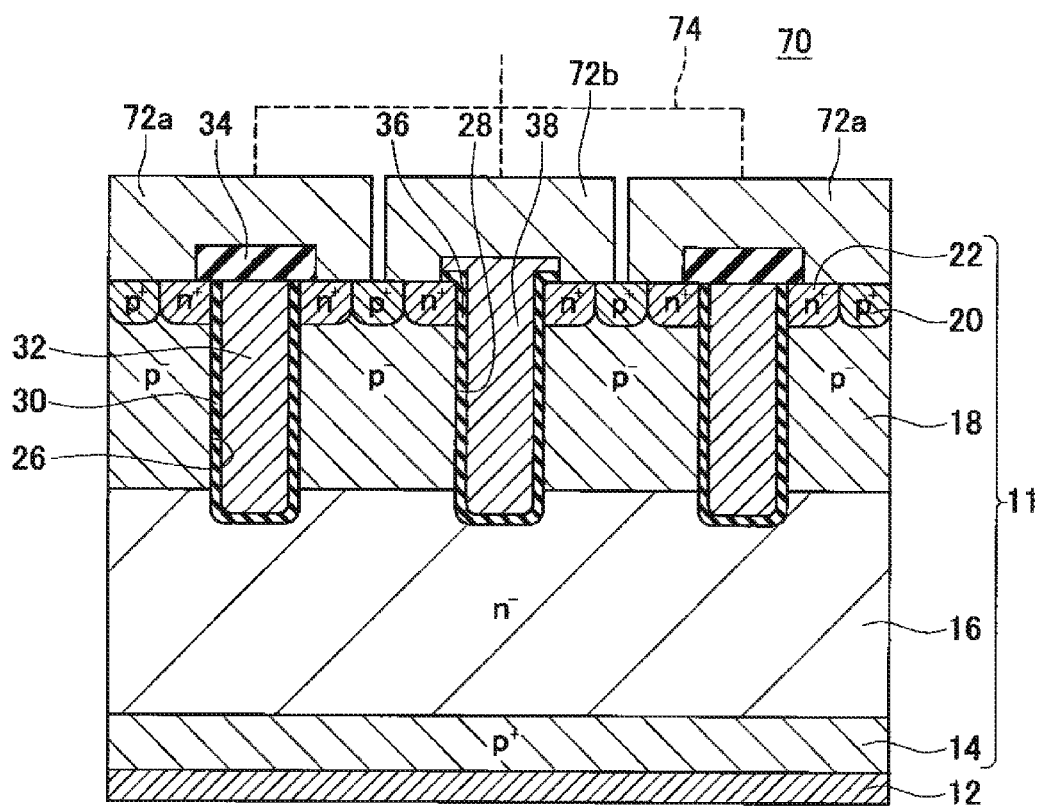
FIG. 6 is a cross-sectional diagram of a semiconductor device according to another modification of Embodiment 1.

For example, as in a semiconductor device 50 shown in FIG. 4, the width of an upper end part of each conductive region 52 may fall within the width of the dummy gate trench 28. Moreover, as in a semiconductor device 60 shown in FIG. 5, an interlayer insulating film 64 may be formed on top of each conductive region 62, and the each conductive region 62 may be electrically connected with the emitter electrode 24 via a wire 66 that is provided independently. According to this configuration, the gate electrodes 32 and the conductive regions 62 have the substantially same configuration. Furthermore, as in a semiconductor device 70 shown in FIG. 6, a first electrode 72a may be formed above each gate electrode 32, and a second electrode 72b may be formed above each conductive region 38. Then, the first electrode 72a and the second electrode 72b may be connected with each other by an external wire 74.

In Embodiment 1 described above, the p-type conductive regions 38 are disposed on all of the dummy gate trenches 28; however, the technology of the present application is not limited to this embodiment. Any configuration may be adopted as long as the emitter electrode 24 and the drift region 16 can be separated by the p-type conductive regions at the sections where the dummy gate trenches 28 are formed.

Figure 7:
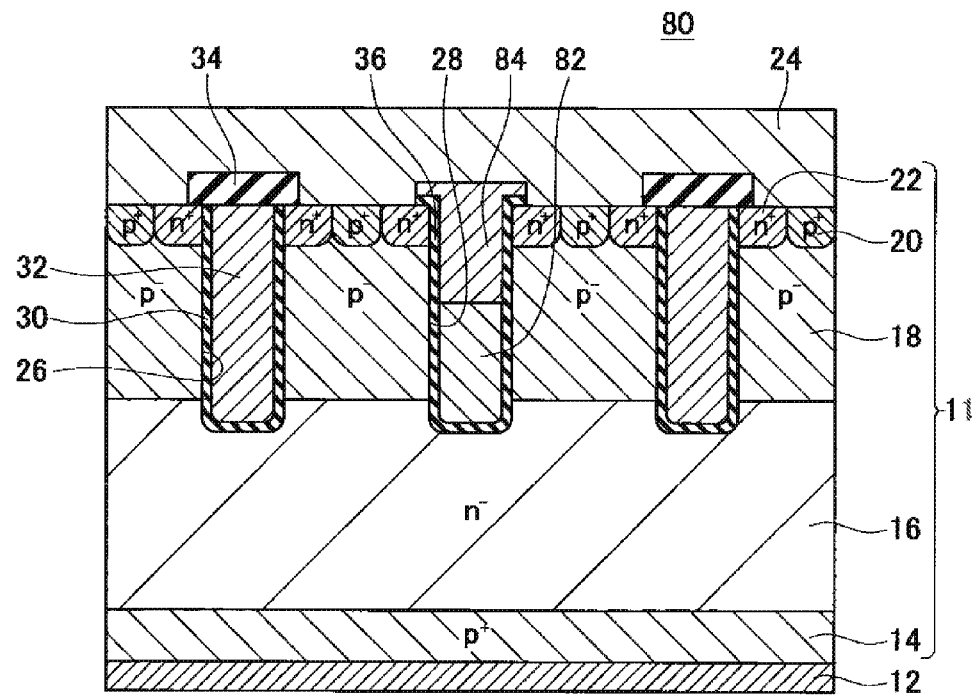
FIG. 7 is a cross-sectional diagram of a semiconductor device according to another modification of Embodiment 1 (same as the cross-sectional diagram taken along line II-II of FIG. 1)
Figure 8:
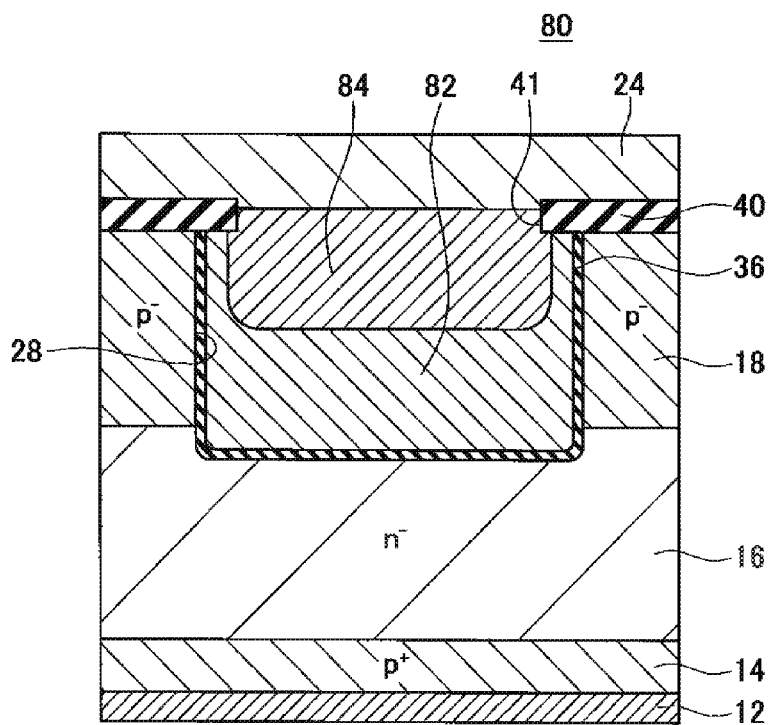
FIG. 8 is a cross-sectional diagram showing another cross section of the semiconductor device shown in FIG. 7 (same as the cross-sectional diagram taken along line III-III of FIG. 1)

For example, the configurations of a semiconductor device 80 shown in FIGS. 7 and 8 may be adopted. In other words, in the semiconductor device 80, the dummy gate trenches 28 are filled with first conductive regions 84 and second conductive regions 82. The first conductive regions 84 are made of a p-type conductive material (e.g., polysilicon doped with a p-type impurity, TiN with p-type characteristics, etc.). Each of the first conductive regions 84 is in contact with the emitter electrode 24 through the entire region of the opening 41 of the insulating film 40 but is not in contact with the insulator 36. Even when polysilicon doped with boron (p-type impurity) is used for each of the first conductive regions 84, the boron is prevented from penetrating the insulator 36 and moving to the low-concentration body region 18, because the first conductive regions 84 are not in contact with the corresponding insulators 36. This can therefore prevent the impurity concentration of the low-concentration body region 18 in the vicinity of the insulators 36 from being changed.

The second conductive regions 82 may be made of a conductive material. Various conductive materials can be used as the conductive material. Examples of the conductive material include polysilicon doped with an n-type or p-type impurity, TiN with p-type characteristics, and TaSiN with n-type characteristics. Each of the second conductive regions 82 is formed below and lateral to the first conductive region 84 and is in contact with the first conductive region 84 and the insulator 36. The second conductive region 82 is separated from the emitter electrode 24 by the first conductive region 84. In other words, the second conductive region 82 is not connected directly with the emitter electrode 24 but is connected to the emitter electrode 24 via the first conductive region 84. Conversely, the first conductive region 84 is separated from the drift region 16 by the second conductive region 82. In other words, the first conductive region 84 is not connected with the drill region 16 without passing the second conductive region 82, and is connected with the drift region 16 via the second conductive region 82.

In this semiconductor device 80 as well, the emitter electrode 24 is separated from the drift region 16 by the p-type first conductive regions 84 at the sections where the dummy gate trenches 28 are formed. Thus, even when poor formation of the insulators 36 electrically connects the second conductive regions 82 to the drift region 16, the generation of the leak current between the emitter electrode 24 and the collector electrode 12 can be prevented.

In the semiconductor device 80, the p-type first conductive regions 84 are formed in a manner as to extend to substantially the centers of the dummy gate trenches 28 in the depth direction thereof. However, the p-type first conductive regions 84 may be formed only on upper end parts (contact parts between the first conductive regions 84 and the emitter electrode).

Figure 9:
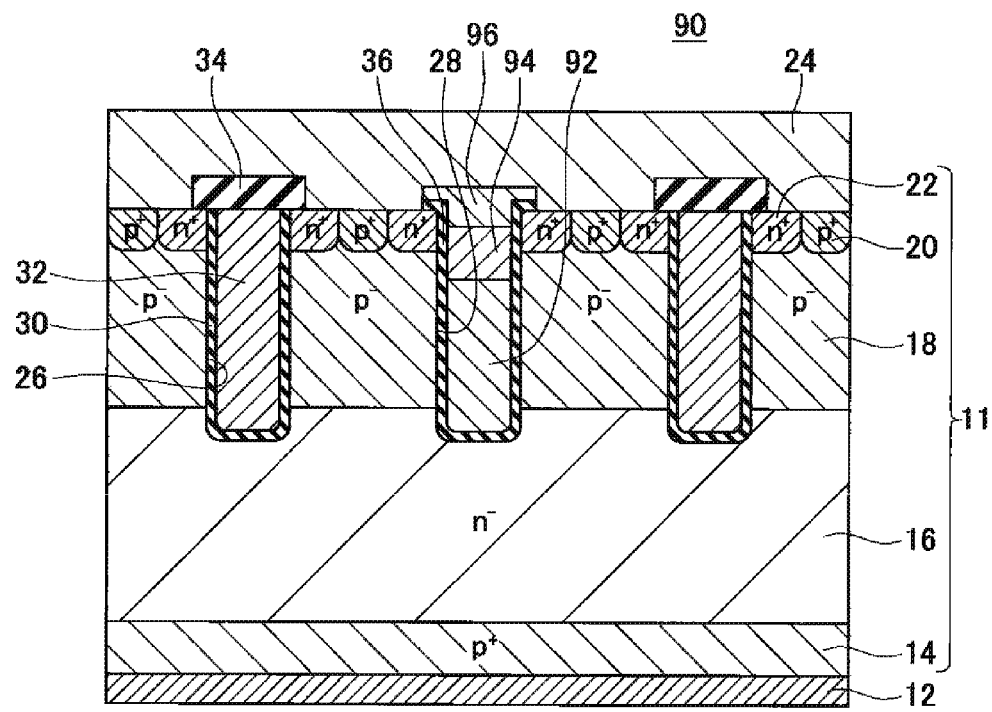
FIG. 9 is a cross-sectional diagram of a semiconductor device according to another modification of Embodiment 1 as the cross-sectional diagram taken along one II-II of FIG. 1)
Figure 10:
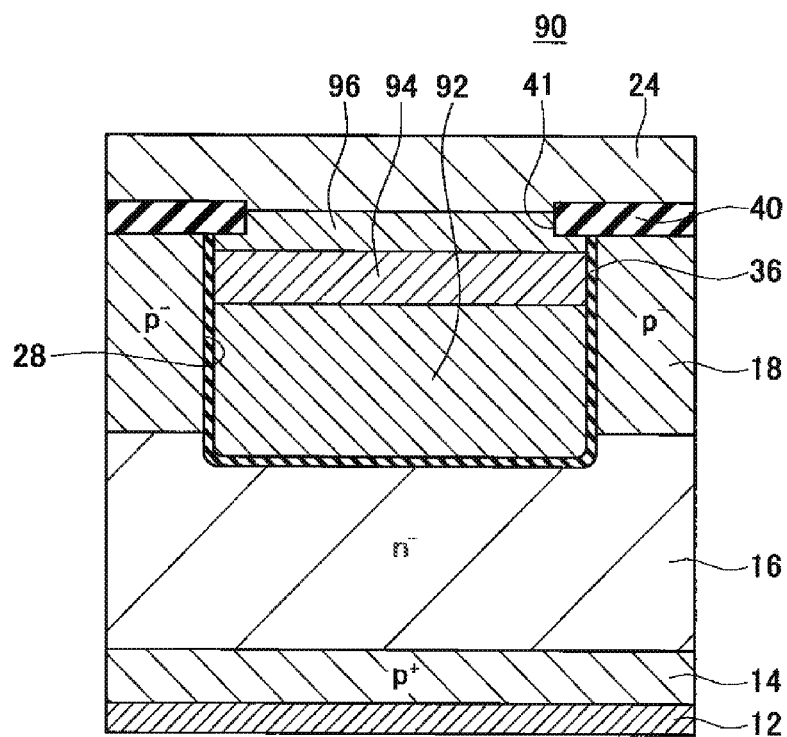
FIG. 10 is a cross-sectional diagram showing another cross section of the semiconductor device shown in FIG. 9 (same as the cross-sectional diagram taken along line III-III of FIG. 1)

The configurations of a semiconductor device 90 shown in FIGS. 9 and 10 may be adopted as well. In other words, in the semiconductor device 90, each dummy gate trench 28 is filled with a first conductive region 96, second conductive region 94, and third conductive region 92. The first conductive region 96 can be made of various conductive materials. Examples of the conductive materials include polysilicon doped with an n-type or p-type impurity, TiN with p-type characteristics, and TaSiN with n-type characteristics. The first conductive region 96 is electrically connected (in contact) with the emitter electrode 24 at the entire region of the opening 41 of the insulating film 40.

The second conductive region 94 is made of a p-type conductive material (e.g., polysilicon doped with a p-type impurity, TiN with p-type characteristics, etc.). The second conductive region 94 is formed under the first conductive region 96. The second conductive region 94 is in contact with a lower surface of the first conductive region 96 and has side surfaces thereof in contact with the corresponding insulator 36.

The third conductive region 92 can be made of various conductive materials. Examples of the conductive materials include polysilicon doped with an n-type or p-type impurity, TiN with p-type characteristics, and TaSiN with n-type characteristics. The third conductive region 92 is formed under the second conductive region 94. The third conductive region 92 is in contact with a lower surface of the second conductive region 94 and has side surfaces thereof in contact with the insulator 36.

In the semiconductor device 90 described above, the entire side surfaces of the p-type second conductive region 94 are in contact with the insulator 36. Therefore, the emitter electrode 24 and the drift region 16 are separated from each other by the p-type second conductive regions 94 at the sections where the dummy gate trenches 28 are formed. In other words, conductive paths that connect the emitter electrode 24 and the drift region 16 with each other always pass through the p-type second conductive regions 94. Therefore, even when the insulators 36 are formed poorly, the generation of the leak current between the emitter electrode 24 and the collector electrode 12 can be prevented.

Figure 11:
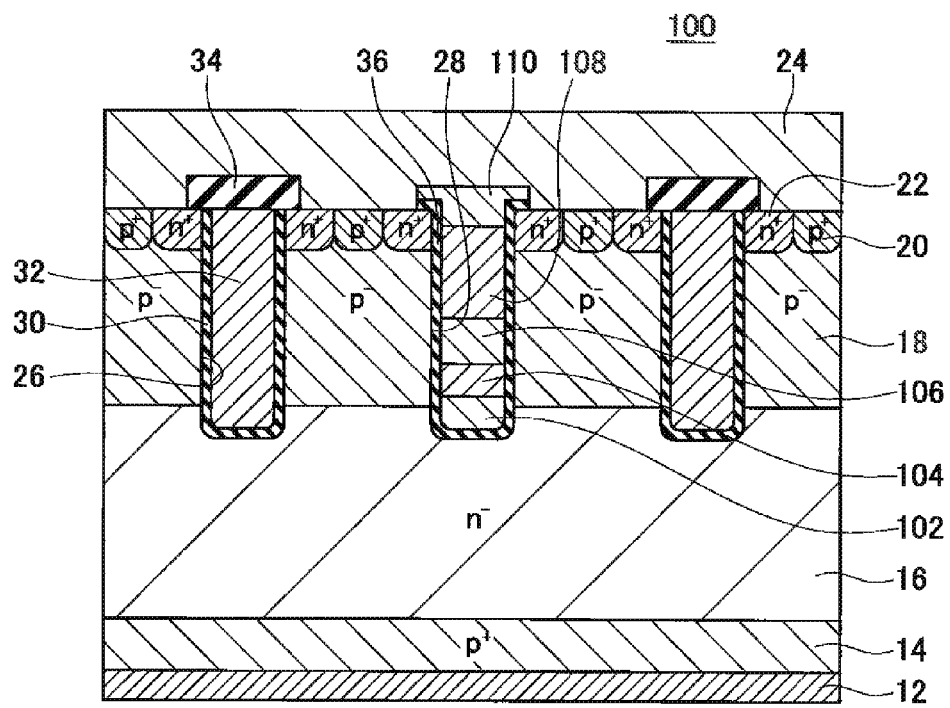
FIG. 11 is a cross-sectional diagram of a semiconductor device according to another modification of Embodiment 1 (same as the cross-sectional diagram taken alone line II-II of FIG. 1)

Furthermore, as in a semiconductor device 100 shown in FIG. 11, a plurality of p-type conductive regions 104, 108 may be provided in each of the dummy gate trenches 28. Entire side surfaces of the p-type conductive regions 104, 108 are in contact with the corresponding insulator 36. Conductive regions 102, 106, 110 may be made of conductive materials. In this semiconductor device 100 as well, the emitter electrode 24 and the drift region 16 are separated from each other by the p-type conductive regions 104, 108 at the sections where the dummy gate trenches 28 are formed. Therefore, even when the insulators 36 are formed poorly, the generation of the leak current between the emitter electrode 24 and the collector electrode 12 can be prevented.

<Embodiment >2

A semiconductor device 120 according to Embodiment 2 is described next. Unlike the semiconductor device 10 according to Embodiment 1, which is a trench gate type semiconductor device, the semiconductor device 120 according to Embodiment 2 is a planar gate type semiconductor device 120.

Figure 12:
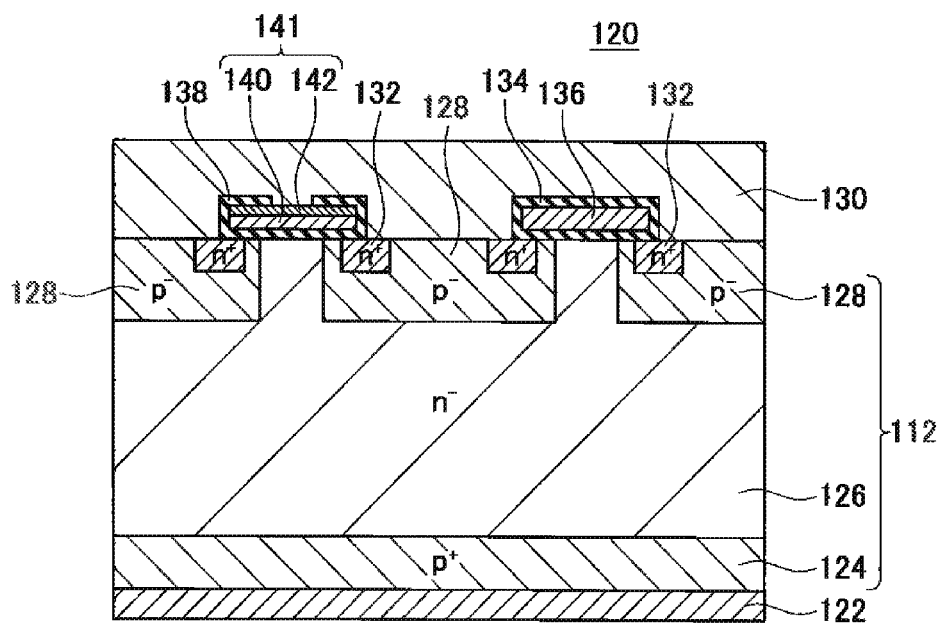
FIG. 12 is a vertical cross-sectional diagram of a semiconductor device according to Embodiment 2.

As shown in FIG. 12, an $n^+$ type emitter region 132, $p^-$ type body region 128, and $n^-$ type drift region 126 are formed in a region near an upper surface of a semiconductor substrate 112 of the semiconductor device 120. The emitter region 132 is surrounded by the body region 128, and the body region 128 is surrounded by the drift region 126. Therefore, the emitter region 132 is separated from the drift region 126 by the body region 128. A $p^+$ type collector region 124 is formed in a region near a lower surface of the semiconductor substrate 112. The collector region 124 is in contact with the lower surface of the drift region 16.

A collector electrode 122 is fooled on the lower surface of the semiconductor substrate 112. The collector electrode 122 is in ohmic-contact with the collector region 124. An emitter electrode 130 is formed on the upper surface of the semiconductor substrate 112. The emitter electrode 130 is in ohmic-contact with the body region 128 and the emitter region 132.

In addition, a gate electrode 136 and conductive region (dummy gate region) 141 are formed on the upper surface of the semiconductor substrate 112. The gate electrode 136 is covered with an insulator 134 and therefore insulated from the emitter electrode 130. The gate electrode 136 is connected with the emitter region 132, body region 128, and drift region 126 via the insulator 134, and faces, via the insulator 134, a part of the body region 128 that separates the emitter region 132 from the drift region 126.

A lower surface, side surfaces, and part of an upper surface of the dummy gate region 141 are covered with an insulator 138. As with the gate electrode 136, the dummy gate region 141 is connected with the emitter region 132, body region 128, and drill region 126 via the insulator 138, and faces, via the insulator 138, a part of the body region 128 that separates the emitter region 132 from the drift region 126. The dummy gate region 141 is configured by a first conductive region 142 and second conductive region 140. The first conductive region 142 is made of a p-type conductive material (e.g., polysilicon doped with a p-type impurity, TiN with p-type characteristics, etc.). The first conductive region 142 is in contact with the emitter electrode 130 at an opening of the insulator 138. The second conductive region 140 may be made of a conductive material. Examples of the conductive material include polysilicon doped with an n-type p-type impurity, TiN with p-type characteristics, and TaSiN with n-type characteristics. The second conductive region 140 is formed under the first conductive region 142.

This semiconductor device 120, too, is provided with the dummy gate conductive region 141 that is electrically connected with the emitter electrode 130, so that the withstand voltage of the semiconductor device 120 can be ensured, while reducing the gate capacitance and increasing the switching speed. Moreover, the dummy gate region 141 has the p-type first conductive region 142. Therefore, in the dummy gate region 141, the emitter electrode 130 and the drift region 126 are separated from each other by the first conductive region 142. Thus, even When the insulator 138 is formed poorly, generation of a leak current between the emitter and the collector can be prevented.

<Embodiment >3

A semiconductor device 160 according to Embodiment 3 is described next. The semiconductor device 160 according to Embodiment 3 is different from the semiconductor device 10 of Embodiment 1 in that the semiconductor device 160 has p-type and $n^-$ type conductive regions disposed in each dummy gate trench 28. The rest of the configuration of the semiconductor device 160 of Embodiment 3 is same as that the semiconductor device 10 of Embodiment 1. The same reference numerals are used for the configurations same as those of the semiconductor device of Embodiment 1 and the descriptions thereof are omitted.

Figure 13:
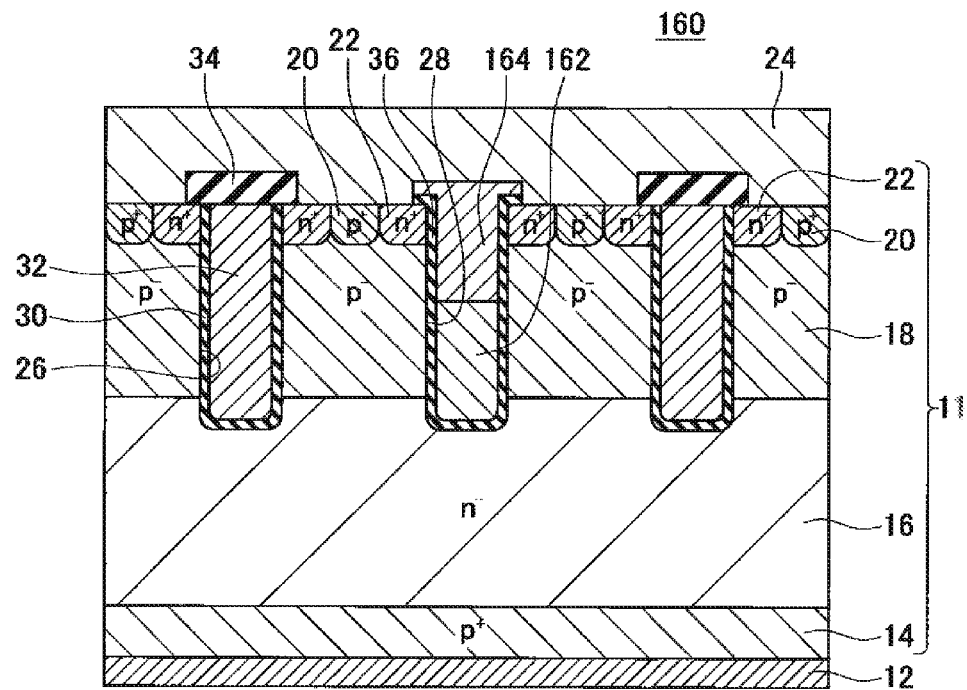
FIG. 13 is a vertical cross-sectional diagram of a semiconductor device according to Embodiment 3.

As shown in FIG. 13, in the semiconductor device 160, each of the dummy gate trenches 28 is filled with a first conductive region 164 and second conductive region 162. The first conductive region 164 is made of a p-type conductive material (e.g., polysilicon doped with a p-type impurity, TiN with p-type characteristics, etc.). An upper part inside the dummy gate trench 28 is filled with the first conductive region 164, which is electrically connected (in contact) with the emitter electrode 24.

The second conductive region 162 is made of an n-type conductive material (e.g., polysilicon doped with an n-type impurity, TaSiN with n-type characteristics, etc.). An n-type impurity concentration of the second conductive region 162 is lower than that of the drift region 16. The second conductive region 162 is formed below the first conductive region 164 and is connected with the drift region 16 via the insulator 36. As with Embodiment 1, the second conductive region 162 is connected with the emitter electrode 24, not directly but via the first conductive region 164.

In the semiconductor device 160 described above, the emitter electrode 24 is separated from the drift region 16 by the p-type first conductive region 164 at the section where the dummy gate trench 28 is formed. Thus, even when the insulator 36 is formed poorly, generation of a leak current between the emitter and the collector can be prevented.

Also, in the semiconductor device 160, a p-n junction is formed at a boundary between the first conductive region 164 disposed on the emitter electrode 24 side and the second conductive region 162 disposed on the drift region 16 side, and the n-type impurity concentration of the second conductive region 162 is lower than that of the drift region 16. Therefore, even when the drill region 16 is electrically connected with the second conductive region 162 due to poor formation of the insulator 36, a depletion layer spreads from the p-n junction surface formed between the first conductive region 164 and the second conductive region 162. This can reduce the intensity of an electric field applied to a tip end part of the dummy gate trench 28 and prevent the concentration of the electric field from lowering the withstand voltage of the semiconductor device 160. As a result, the withstand voltage of the semiconductor device 160 can be kept high, even when the insulator 36 is formed poorly.

In this semiconductor device 160, the n-type impurity concentration of the second conductive region 162 may be constant or may decline gradually from the drift region 16 toward the emitter electrode 24. Even when the n-type impurity concentration of the second conductive region 162 declines gradually from the drift region 16 toward the emitter electrode 24, it is preferred that the maximum value of the n-type impurity concentration of the second conductive region 162 be lower than the n-type impurity concentration of the drift region 16. Accordingly, the withstand voltage of the semiconductor device can be kept high.

The p-type conductive regions and the n⁻ type conductive regions can be disposed in various ways in the dummy gate trenches 28. For example, as in a semiconductor device 170 shown in FIG. 14, a p-type first conductive region 178, n-type second conductive region 176, p-type third conductive region 174, and n-type fourth conductive region 172 may be disposed in this order, starting from the emitter electrode 24, in each of the dummy gate trenches 28. In this case, the entire side surfaces of each of the conductive regions 178, 176, 174, and 172 come into contact with the insulator 36, and the n-type impurity concentrations of the conductive regions 176 and 172 are lower than the n-type impurity concentration of the drift region 16. In the semiconductor device 170 as well, the same effects as those of the semiconductor device 160 can be achieved.

The n-type impurity concentrations of the conductive regions 176 and 172 may be equal to each other or different from each other. When the n-type impurity concentrations of the conductive regions 176 and 172 are different from each other, it is preferred that the n-type impurity concentration of the conducive region 176 be lower than that of the conductive region 172. In this case, because the n-type impurity concentration gradually declines from the drift region 16 toward the emitter electrode 24, the withstand voltage of the semiconductor device can be increased.

Figure 15:
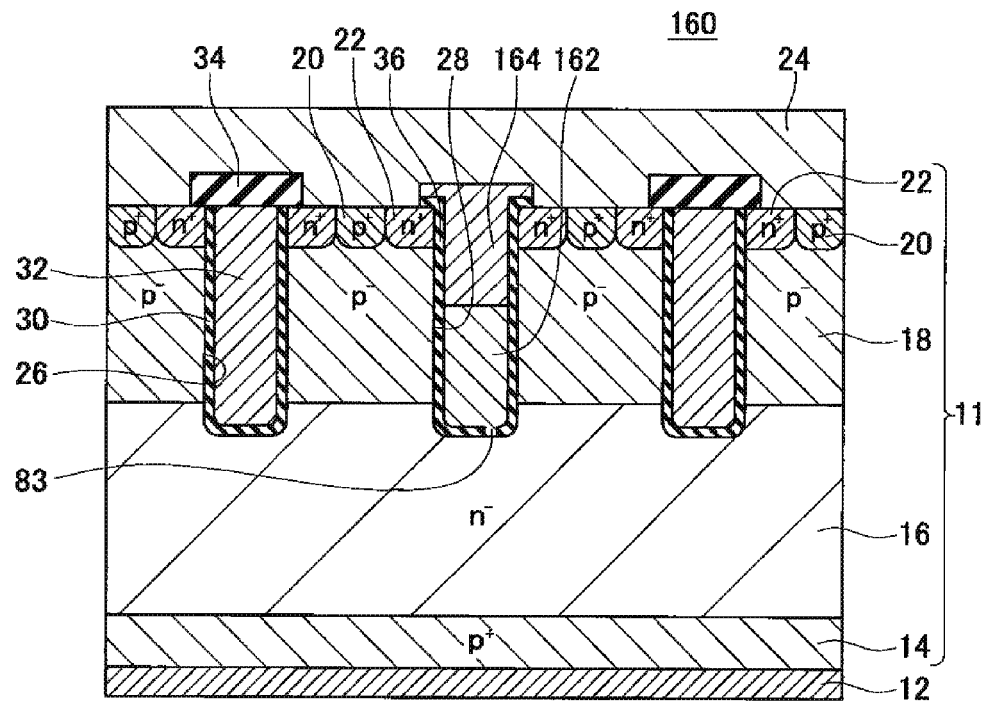
FIG. 15 is a diagram for explaining calculation conditions for simulating a withstand voltage of the semiconductor device shown in FIG. 13 when an insulator of the semiconductor device is formed poorly.

Now is described a result that is obtained by performing a simulated calculation on the withstand voltage of the semiconductor device where the p-type conductive regions and the n⁻ type conductive regions are disposed in each dummy gate trench, the withstand voltage being obtained when the insulator in the wall surface of the dummy gate trench is formed poorly. FIG. 15 shows a simulation in which a hole 83 is formed on a lower surface of the insulator 36 in the semiconductor device 160 described above. The diameter of the hole 83 is 0.1 µm. A p-type impurity concentration of the first conductive region 164 is $4.0 \times e^{13}$ atoms/cm³, the n-type impurity concentration of the second conductive region 162 is $4.0 \times e^{13}$ atoms/cm³, the n-type impurity concentration of the drift region 16 is $9.35 \times e^{13}$ atoms/cm³, and the maximum p-type impurity concentration of the body region 18 is $2.3 \times e^{17}$ atoms/cm³. In this simulation, the calculation was performed by changing the position of the boundary between the first conductive region 164 and the second conductive region 162 in the depth direction of the semiconductor substrate 11.

Figure 16:
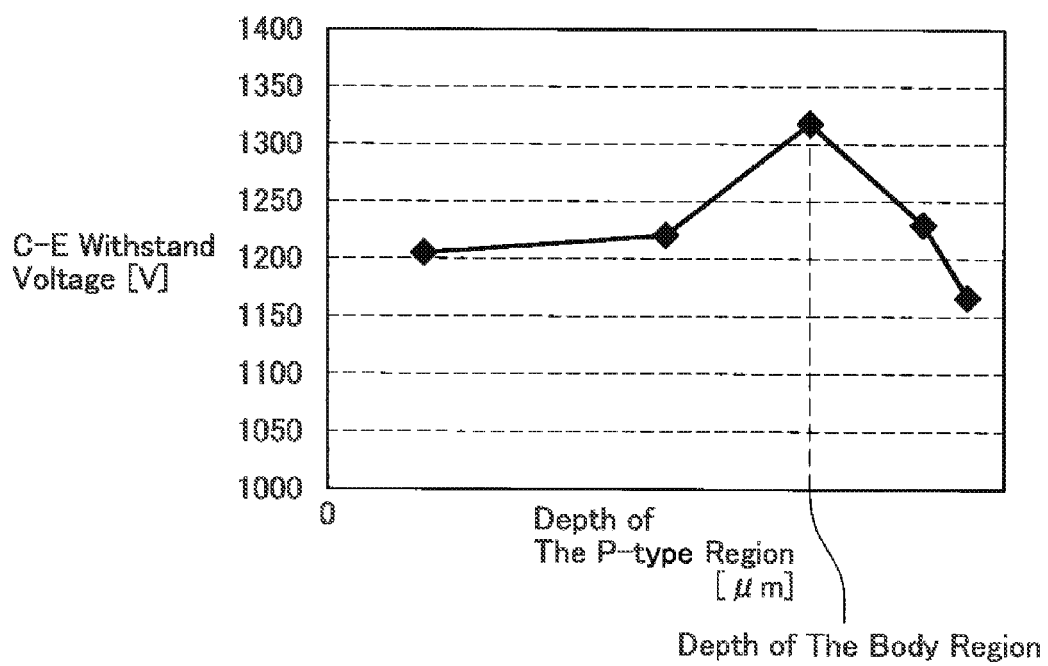
FIG. 16 is a diagram showing a result of the withstand voltage simulation.

FIG. 16 is a graph wherein the vertical axis shows the withstand voltage between the collector and the emitter and the horizontal axis a position of a lower surface of the first conductive region (p-type region) 164. As shown in FIG. 16, the maximum withstand voltage is obtained when the boundary between the first conductive region 164 and the second conductive region 162 matched the lower surface of the body region 16. When the lower surface of the first conductive region 164 matches the bottom of the dummy gate trench 28 (when the inside of the dummy gate trench 28 is entirely the p-type first conductive region 164), the withstand voltage slightly declines, compared to that obtained under the other conditions. While the withstand voltage becomes less than 1 V in the conventional technology (a semiconductor device in which an n-type polysilicon region is formed inside each dummy gate trench), the withstand voltage in the present invention is 1000 V or higher under any conditions. Thus, it was confirmed that the technology of the present application is more advantageous.

Figure 14:
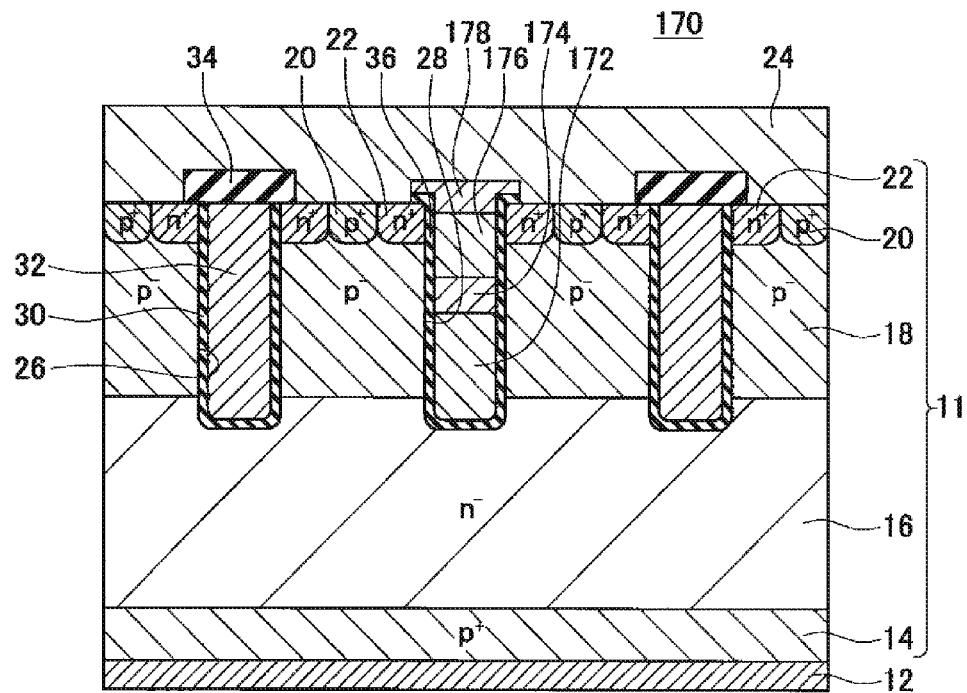
FIG. 14 is a vertical cross-sectional diagram of a semiconductor device according to a modification of Embodiment 3.

The withstand voltage of the semiconductor device 170 shown in FIG. 14 was simulated as well. The same results as those shown in FIG. 16 were obtained. In other words, the maximum withstand voltage was obtained when the position of the p-n junction on the drift region 16 side (the boundary between the third conductive region 174 and the fourth conductive region 172) matched the lower surface of the body region 18. Note that the withstand voltage of the semiconductor device 170 also was 1000 V or higher.

<Embodiment >4

Figure 17:
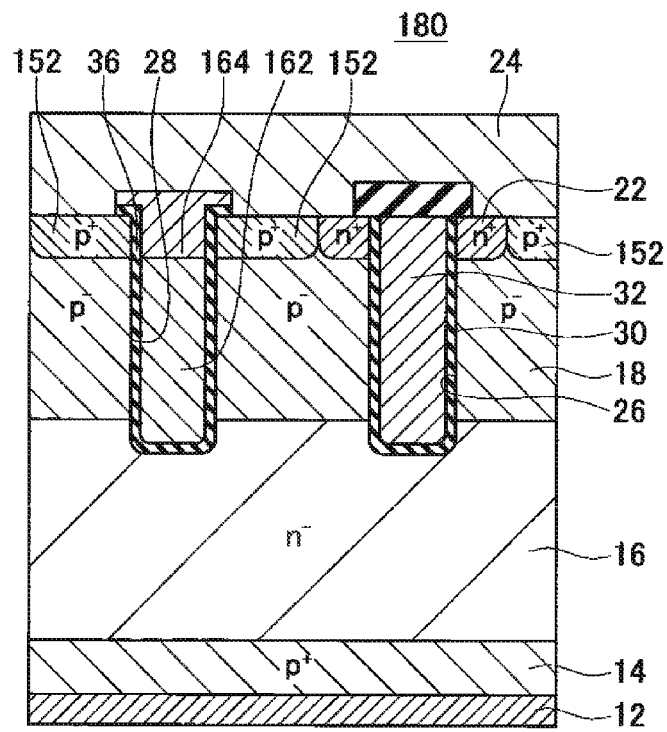
FIG. 17 is a vertical cross-sectional diagram of a semiconductor device according to Embodiment 4.

A semiconductor device 180 of Embodiment 4 is described next. As shown in FIG. 17, the semiconductor device 180 of Embodiment 4 is different from the semiconductor device 160 of Embodiment 3 in that (1) no emitter regions are formed in contact with the insulator 36 on the inner wall surface of each dummy gate trench 28 and that (2) the boundary between the first conductive region 164 and the second conductive region 162 matches a lower surface of a body contact region 152. The rest of the configuration of the semiconductor device 180 of Embodiment 4 is same as that of the semiconductor device 160 of Embodiment 3. The same reference numerals are used for the components same as those of the semiconductor device of Embodiment 3, and the descriptions thereof are omitted.

As shown in FIG. 17, in the semiconductor device 180, not the emitter regions 22 but the body contact regions 152 are formed in contact with the insulator 36 on the inner wall surface of the dummy gate trench 28. In the present embodiment, because the on-potential (gate potential) is not applied to the conductive regions 164, 162 filling the inside of the dummy gate trench 28, a channel is not formed in the low-concentration body region 18 in the vicinity of the dummy gate trench 28. Therefore, the body contact regions 152 can be formed in place of the emitter regions 22.

In the semiconductor device 180, each dummy gate trench 28 filled with the p-type first conductive region 164 and the n-type second conductive region 162, and the boundary between the first conductive region 164 and the second conductive region 162 matches the lower surface of each body contact region 152. Thus, the step of forming the body contact regions 152 can be the same as the step of forming the first conductive regions 164.

A method for producing the above-described semiconductor device 180 is described next. A conventionally-known production method can be used as a method for producing the structures other than the structures of the first conductive region 164 and the second conductive region 162; thus, the explanation thereof is omitted.

Figure 18:
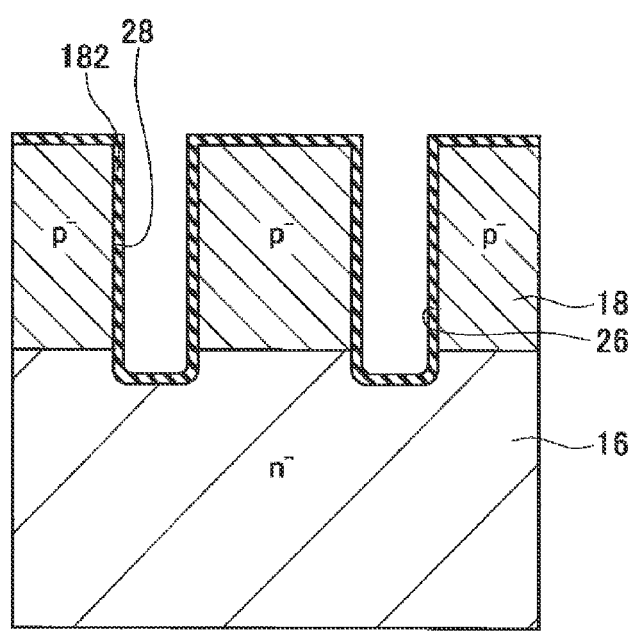
FIG. 18 is a diagram for explaining a process of producing the semiconductor device according to Embodiment 4 (1)
Figure 19:
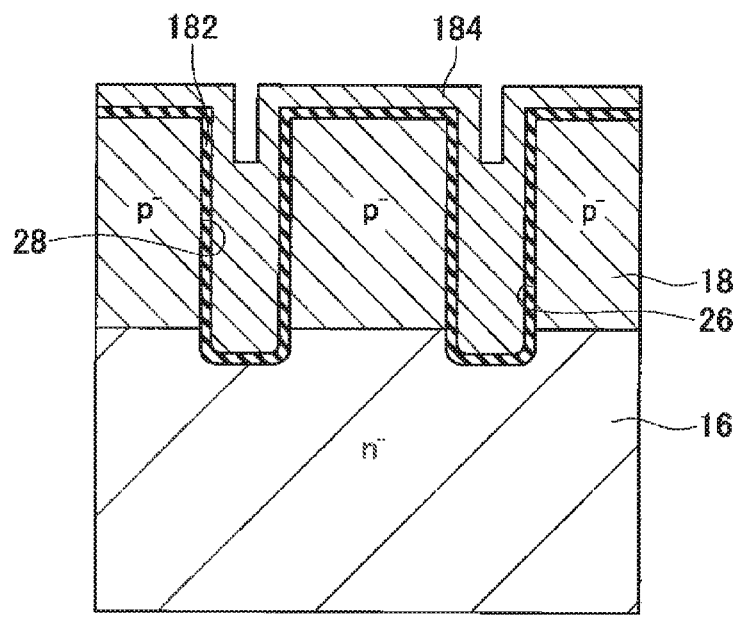
FIG. 19 is a diagram for explaining the process of producing the semiconductor device according to Embodiment 4 (2)
Figure 20:
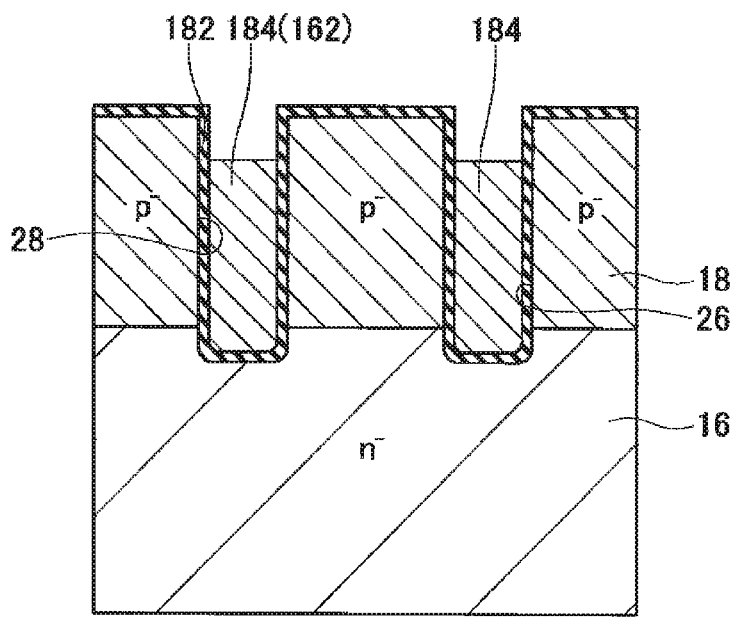
FIG. 20 is a diagram for explaining the process of producing the semiconductor device according to Embodiment 4 (3)
Figure 21:
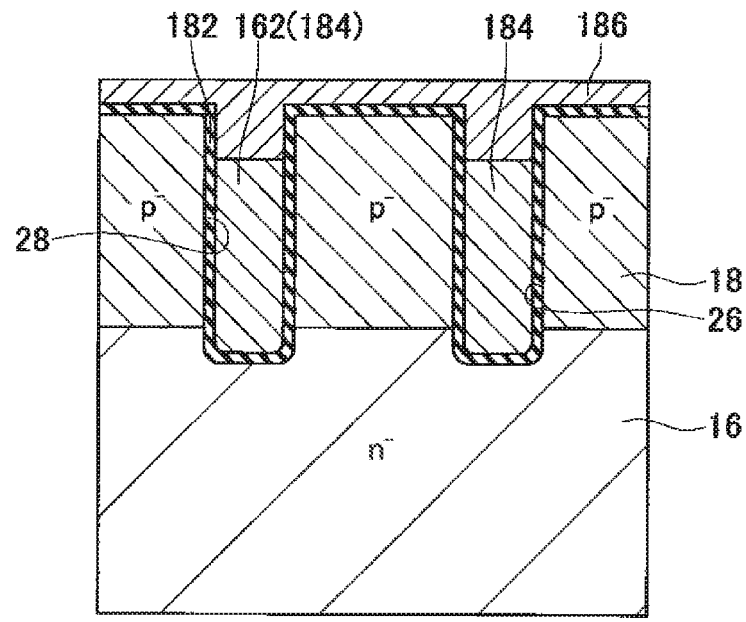
FIG. 21 is a diagram for explaining the process of producing the semiconductor device according to Embodiment 4 (4)
Figure 22:
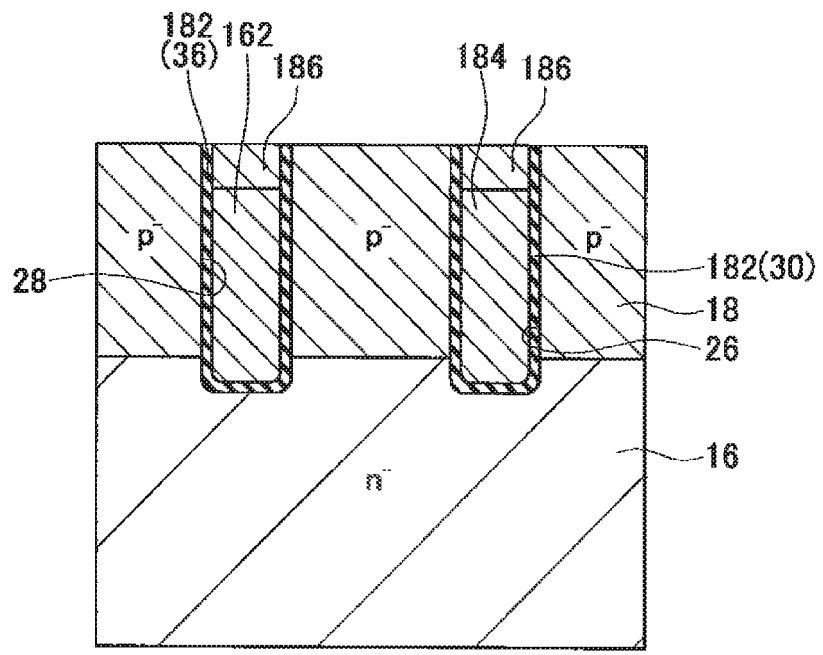
FIG. 22 is a diagram for explaining the process of producing the semiconductor device according to Embodiment 4 (5)

As shown in FIG. 18, the gate trenches 26 and the dummy gate trenches 28 are formed from the upper surface of the semiconductor substrate in which the body regions 18 are laminated on the drill region 16, and then an insulator 182 is formed on the surface of the semiconductor substrate. Subsequently, as shown in FIG. 19, polysilicon 184 doped with an n-type impurity is deposited on the surface of the semiconductor substrate. The deposited polysilicon 184 is subjected to etch back, as shown in FIG. 20. Next, as shown in FIG. 21, polysilicon 186 that is not doped with an impurity is deposited on the surface of the polysilicon 184. The polysilicon 186 on the semiconductor substrate is subjected to etch back, as shown in FIG. 22.

Figure 23:
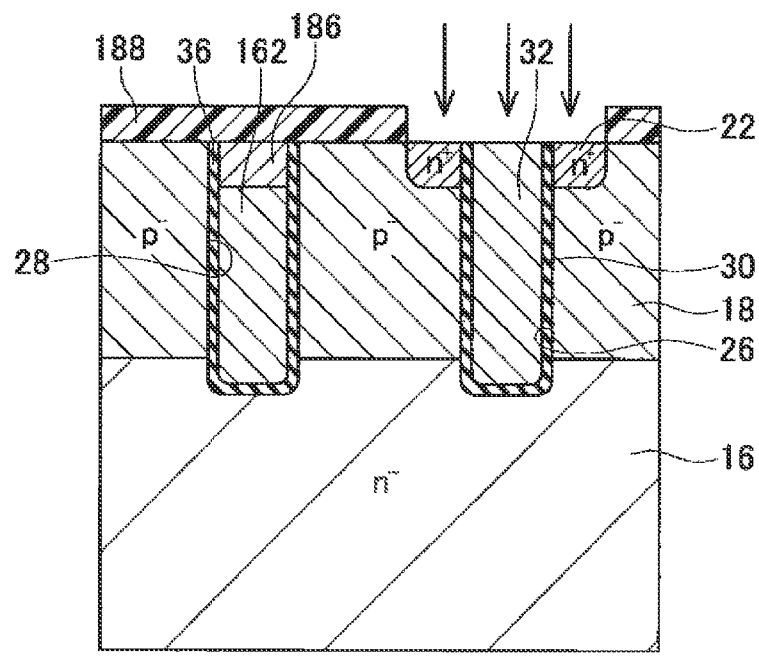
FIG. 23 is a diagram for explaining the process of producing the semiconductor device according to Embodiment 4 (6)

Next, as shown FIG. 23, a resist is applied to the semiconductor substrate, which is then patterned into a mask 188. The mask 188 has an opening on regions formed as the emitter regions 22 and a region formed as the gate electrode 32. Then, an n-type impurity is implanted into the semiconductor substrate from above the mask 188. The implanted impurity is then thermally diffused. As a result, the emitter regions 22 are formed in the regions that are in contact with each gate trench 26. Furthermore, the type of the polysilicon 186 of each gate trench 26 becomes the n-type, whereby the gate electrode 32 is formed therein.

Figure 24:
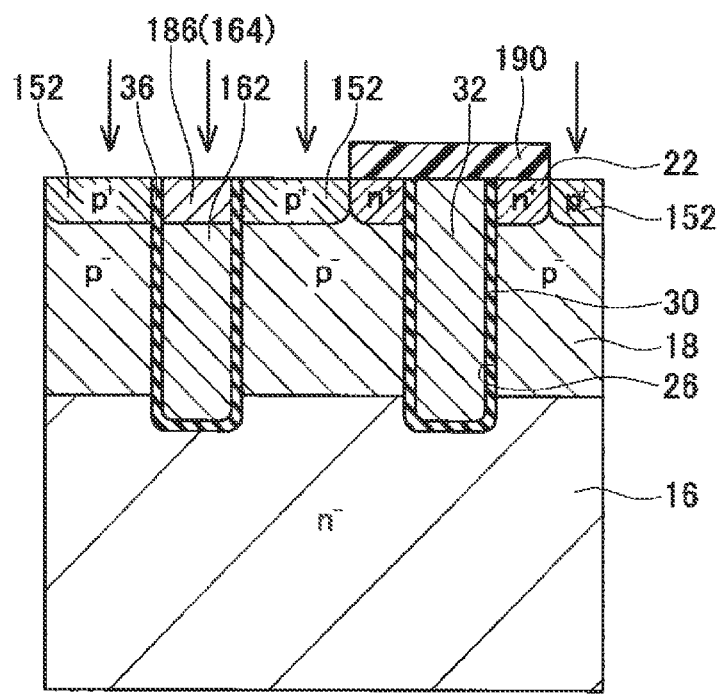
FIG. 24 is a diagram for explaining the process of producing the semiconductor device according to Embodiment 4 (7)
Figure 25:
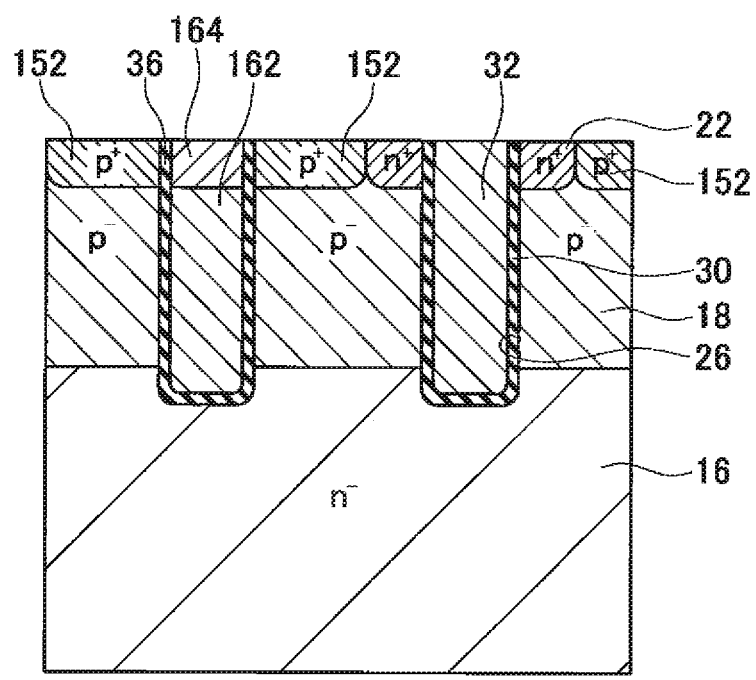
FIG. 25 is a diagram for explaining the process of producing the semiconductor device according to Embodiment 4 (8).

Subsequently, as shown in FIG. 24, a resist is applied to the semiconductor substrate, which is then patterned into a mask 190. The mask 190 has an opening on regions formed as the body contact regions 152 and a region formed as the first conductive region 164. Then, a p-type impurity is implanted into the semiconductor substrate from above the mask 190. The implanted impurity is then thermally diffused. As a result, the body contact regions 152 are formed in the regions that are in contact with each dummy gate trench 28. Furthermore, the type of the polysilicon 186 of each dummy gate trench 28 becomes the p-type, whereby the first conductive region 164 is formed therein (FIG. 25).

In the production method described above, the step of forming the body contact regions 152 is the same as the step of forming the first conductive regions 164. Therefore, the semiconductor device 180 can be produced with fewer steps.

Each of these embodiments has described the vertical semiconductor device in which a current flows inside of the semiconductor substrate in a vertical direction (thickness direction). However, the technology of the present application can be applied to a lateral semiconductor device in which a current flows inside a semiconductor substrate in a horizontal direction (a direction perpendicular to the thickness direction).

Each of the embodiments is an example of a semiconductor device in which the first conductive type is the p-type and the second conductive type is the n-type. However, the technology of the present application can be applied to a semiconductor device in which the first conductive type is the n-type and the second conductive type is the p-type. In other words, the technology of the present application can be applied to a semiconductor device in which the collector region is the n-type region, the drift region the p-type region, the body regions the n-type regions, and the emitter regions the p-type regions. In this case, the emitter electrode may be separated from the drift region (p-type) by the n-type conductive regions at the sections where the dummy gate trenches are formed. The n-type conductive regions can be made of; for example, polysilicon doped with an n-type impurity or TaSiN with n-type characteristics.

While examples of the present invention have been described in detail, such examples are merely illustrative and are not intended to limit the scope of claims. Techniques described in the scope of claims include various modifications and changes of the specific examples illustrated above.

It is to be understood that the technical elements described in the present specification and the drawings exhibit technical usefulness solely or in various combinations thereof and shall not be limited to the combinations described in the claims at the time of filing. Furthermore, the techniques illustrated in the present specification and the drawings are to achieve a plurality of objectives at the same time, whereby technical usefulness is exhibited by attaining any one of such objectives.

The invention claimed is:
1. A semiconductor device comprising:
a first semiconductor region of a first conductive type;
a second semiconductor region of a second conductive type, the second semiconductor region being in contact with the first semiconductor region;
a third semiconductor region of the first conductive type, the third semiconductor region being in contact with the second semiconductor region and separated from the first semiconductor region by the second semiconductor region;
a fourth semiconductor region of the second conductive type, the fourth semiconductor region being in contact with the third semiconductor region and separated from the first and second semiconductor regions by the third semiconductor region;
a first main electrode electrically connected with the first semiconductor region;
a second main electrode electrically connected with the third and fourth semiconductor regions;
a gate electrode insulated from the second main electrode, the gate electrode being connected with the second, third and fourth semiconductor regions via a first insulating film, and opposing a part of the third semiconductor region via the first insulating film, the part of the third semiconductor region separating the fourth semiconductor region from the second semiconductor region; and
a conductive region electrically connected with the second main electrode, the conductive region being connected with the second and third semiconductor regions via a second insulating film, wherein
the conductive region comprises a first conductive region of the first conductive type, and a second conductive region of the second conductive type, the second conductive region being in contact with the first conductive region,
a second conductive type impurity concentration of the second conductive region is lower than that of the second semiconductor region, and
within the conductive region, the first conductive region separates the second main electrode from the second semiconductor region, the second main electrode is separated from the second conductive region by the first conductive region, and the second semiconductor region is separated from the first conductive region by the second conductive region.

2. The semiconductor device as in claim 1, wherein
the first conductive type is p type,
the second conductive type is n type, and
the first conductive region is in contact with the second main electrode, and is not in contact with the second insulating film.

3. The semiconductor device as in claim 1, wherein
the conductive region is further in contact with the fourth semiconductor region via the second insulating film, and opposes a part of the third semiconductor region via the second insulating film, the part of the third semiconductor region separating the fourth semiconductor region from the second semiconductor region.

4. The semiconductor device as in claim 3, wherein
the third semiconductor region is disposed below and lateral to the fourth semiconductor region, the second semiconductor region is disposed below the third semiconductor region, the first semiconductor region is disposed below the second semiconductor region, the first main electrode is disposed below the first semiconductor region, the second main electrode is disposed on an upper side of the third and fourth semiconductor regions, the gate electrode is disposed within a first trench that penetrates the third semiconductor region from an upper surface of the fourth semiconductor region and reaches to the second semiconductor region, and the conductive region is disposed within a second trench that penetrates the third semiconductor region and reaches to the second semiconductor region.

5. The semiconductor device as in claim 4, wherein
the second conductive region is disposed at a bottom of the second trench, the first conductive region is disposed on an upper side of the second conductive region, and a boundary between the first conductive region and the second conductive region is at a same height as a boundary between the second semiconductor region and the third semiconductor region.

6. The semiconductor device as in claim 1, wherein
the third semiconductor region is disposed below and lateral to the fourth semiconductor region, the second semiconductor region is disposed below the third semiconductor region, the first semiconductor region is disposed below the second semiconductor region, the first main electrode is disposed below the first semiconductor region, the second main electrode is disposed on an upper side of the third and fourth semiconductor regions, the gate electrode is disposed within a first trench that penetrates the third semiconductor region from an upper surface of the fourth semiconductor region and reaches to the second semiconductor region, and the conductive region is disposed within a second trench that penetrates the third semiconductor regions and reaches to the second semiconductor region.

7. The semiconductor device as in claim 6, wherein
the second conductive region is disposed at a bottom of the second trench, the first conductive region is disposed on an upper side of the second conductive region, and a boundary between the first conductive region and the second conductive region is at a same height as a boundary between the second semiconductor region and the third semiconductor region.

8. The semiconductor device as in claim 1, wherein
the third semiconductor region is disposed below and lateral to the fourth semiconductor region, the second semiconductor region is disposed below and lateral to the third semiconductor region, the first semiconductor region is disposed below the second semiconductor region, the first main electrode is disposed below the first semiconductor region, the second main electrode is disposed on an upper side of the third and fourth semiconductor regions, the gate electrode is in contact with upper surfaces of the fourth, third, and second semiconductor regions via the first insulating film, and the conductive region is in contact with the upper surfaces of the third and second semiconductor regions via the second insulating film.

9. A semiconductor device comprising:
a first semiconductor region of a first conductive type;
a second semiconductor region of a second conductive type, the second semiconductor region being in contact with the first semiconductor region;
a third semiconductor region of the first conductive type, the third semiconductor region being in contact with the second semiconductor region and separated from the first semiconductor region by the second semiconductor region;
a fourth semiconductor region of the second conductive type, the fourth semiconductor region being in contact with the third semiconductor region and separated from the first and second semiconductor regions by the third semiconductor region;
a first main electrode electrically connected with the first semiconductor region;
a second main electrode electrically connected with the third and fourth semiconductor regions;
a gate electrode insulated from the second main electrode, the gate electrode being connected with the second, third and fourth semiconductor regions via a first insulating film, and opposing a part of the third semiconductor region via the first insulating film, the part of the third semiconductor region separating the fourth semiconductor region from the second semiconductor region; and
a conductive region electrically connected with the second main electrode, the conductive region being connected with the second and third semiconductor regions via a second insulating film, wherein
the conductive region comprises a first conductive region of the first conductive type, and a second conductive region of the second conductive type, the second conductive region being in contact with the first conductive region,
a second conductive type impurity concentration of the second conductive region is lower than that of the second semiconductor region,
the first conductive region separates the second main electrode from the second semiconductor region within the conductive region,
the third semiconductor region is disposed below and lateral to the fourth semiconductor region,
the second semiconductor region is disposed below the third semiconductor region,
the first semiconductor region is disposed below the second semiconductor region,
the first main electrode is disposed below the first semiconductor region,
the second main electrode is disposed on an upper side of the third and fourth semiconductor regions,
the gate electrode is disposed within a first trench that penetrates the third semiconductor region from an upper surface of the fourth semiconductor region and reaches to the second semiconductor region,
the conductive region is disposed within a second trench that penetrates the third semiconductor region and reaches to the second semiconductor region,
the second conductive region is disposed at a bottom of the second trench,
the first conductive region is disposed on an upper side of the second conductive region, and
a boundary between the first conductive region and the second conductive region is at a same height as a boundary between the second semiconductor region and the third semiconductor region.

* * * * *